US011998976B2

(12) United States Patent
Iverson et al.

(10) Patent No.: US 11,998,976 B2
(45) Date of Patent: Jun. 4, 2024

(54) SYSTEMS AND METHODS FOR ENHANCED COOLING DURING DIRECTIONAL SOLIDIFICATION OF A CASTING COMPONENT

(71) Applicant: General Electric Company, Schenectady, NY (US)

(72) Inventors: Jared Micheal Iverson, Tremonton, UT (US); Christopher Raymond Hanslits, Simpsonville, SC (US); Shenyan Huang, Niskayuna, NY (US); Canan Uslu Hardwicke, Greenville, SC (US)

(73) Assignee: GE Infrastructure Technology LLC, Greenville, SC (US)

( * ) Notice: Subject to any disclaimer, the term of this patent is extended or adjusted under 35 U.S.C. 154(b) by 0 days.

(21) Appl. No.: 17/939,347

(22) Filed: Sep. 7, 2022

(65) Prior Publication Data
US 2024/0075521 A1 Mar. 7, 2024

(51) Int. Cl.
*B22D 27/04* (2006.01)
*C30B 29/52* (2006.01)

(52) U.S. Cl.
CPC ........... *B22D 27/045* (2013.01); *C30B 29/52* (2013.01)

(58) Field of Classification Search
CPC ....... B22D 15/00; B22D 27/04; B22D 27/045
USPC ......... 164/122.1, 122.2, 125, 126, 127, 128, 164/338.1, 348, 361, 256, 258
See application file for complete search history.

(56) References Cited

U.S. PATENT DOCUMENTS

| 3,810,504 | A | 5/1974 | Piwonka |
| 5,921,310 | A | 7/1999 | Kats et al. |
| 2003/0234092 | A1 | 12/2003 | Brinegar |
| 2013/0022803 | A1* | 1/2013 | Schaeffer et al. ....... F01D 5/147 164/122.2 |
| 2014/0127032 | A1 | 5/2014 | Naik |

FOREIGN PATENT DOCUMENTS

| CN | 103147117 A | 6/2013 |
| JP | 2017159338 A | 9/2017 |

OTHER PUBLICATIONS

International Search Report Corresponding to Application No. PCT/US2023/073320 on Dec. 26, 2023.

* cited by examiner

*Primary Examiner* — Kevin P Kerns
(74) *Attorney, Agent, or Firm* — Dority & Manning, P.A.

(57) ABSTRACT

A casting system for forming a directionally-solidified casting component is provided. The casting system defines an axial direction, a radial direction, and a circumferential direction. The casting system includes a chamber and a baffle plate disposed within the chamber. The chamber and the baffle plate collectively define a heating zone and a cooling zone. The heating zone and the cooling zone are separated by the baffle plate. The casting system further includes a shaft and a cooling plate disposed on the shaft. The cooling plate is movable between the heating zone and the cooling zone. A mold shell is disposed on the cooling plate. The casting system further includes a cooling system for directing a coolant fluid towards the mold shell.

12 Claims, 10 Drawing Sheets

SYSTEMS AND METHODS FOR ENHANCED COOLING DURING DIRECTIONAL SOLIDIFICATION OF A CASTING COMPONENT

FIELD

The present invention generally relates to materials and processes for producing directionally-solidified castings, and particularly to reducing defects in alloys cast as single-crystal (SX) and directionally-solidified (DS) articles suitable for use as components of gas turbines and other high temperature applications.

BACKGROUND

Components of gas turbines, such as blades, vanes and combustor components, are typically formed of nickel, cobalt or iron-base superalloys characterized by desirable mechanical properties at turbine operating temperatures. Because the efficiency of a gas turbine is dependent on its operating temperatures, there is a demand for components, and particularly turbine buckets, nozzles, combustor components, and other hot gas path components, that are capable of withstanding higher temperatures. As the material requirements for gas turbine components have increased, various processing methods and alloying constituents have been used to enhance the mechanical, physical and environmental properties of components formed from superalloys. For example, buckets, nozzles and other components employed in demanding applications are often cast by directional casting techniques to have DS or SX microstructures, characterized by a crystal orientation or growth direction in a selected direction to produce columnar polycrystalline or single-crystal articles.

Directional casting techniques for producing SX and DS castings generally entail pouring a melt of the desired alloy into an investment mold held at a temperature above the liquidus temperature of the alloy. Solidification of the molten alloy within the mold occurs by gradually withdrawing the mold from a heated zone and into a cooling zone, where cooling occurs by convection and/or radiation. Solidification initiates at the base of the mold and the solidification front progresses to the top of the mold. A high thermal gradient is required at the solidification front to prevent nucleation of new grains during directional solidification processes.

Grain defects can occur during the directional solidification process of geometrically complex components because of local hot spots that do not cool at the same rate as the remainder of the component. As such, an improved system and method for cooling a casting component during the directional solidification process is desired and would be appreciated in the art.

BRIEF DESCRIPTION

Aspects and advantages of the casting systems and methods in accordance with the present disclosure will be set forth in part in the following description, or may be obvious from the description, or may be learned through practice of the technology.

In accordance with one embodiment, a casting system for forming a directionally-solidified casting component is provided. The casting system defines an axial direction, a radial direction, and a circumferential direction. The casting system includes a chamber and a baffle plate disposed within the chamber. The chamber and the baffle plate collectively define a heating zone and a cooling zone. The heating zone and the cooling zone are separated by the baffle plate. The casting system further includes a shaft and a cooling plate disposed on the shaft. The cooling plate is movable between the heating zone and the cooling zone. A mold shell is disposed on the cooling plate. The casting system further includes a cooling system for directing a coolant fluid towards the mold shell.

In accordance with another embodiment, a method of forming a directionally-solidified casting component using a casting system is provided. The casting system includes a chamber having a heating zone and a cooling zone separated by a baffle plate. The method includes pouring an alloy in a liquid state into a mold shell. The mold shell is positioned on a cooling plate within the heating zone. Moving the mold shell from the heating zone into the cooling zone. The alloy transfers from the liquid state to a solid state within the mold shell while moving the mold shell from the heating zone to the cooling zone. The method further includes directing a coolant fluid towards the mold shell with a cooling system.

These and other features, aspects and advantages of the present casting systems and methods will become better understood with reference to the following description and appended claims. The accompanying drawings, which are incorporated in and constitute a part of this specification, illustrate embodiments of the technology and, together with the description, serve to explain the principles of the technology.

BRIEF DESCRIPTION OF THE DRAWINGS

A full and enabling disclosure of the present casting systems and methods, including the best mode of making and using the present systems and methods, directed to one of ordinary skill in the art, is set forth in the specification, which makes reference to the appended figures, in which.

DETAILED DESCRIPTION

Figure 1:
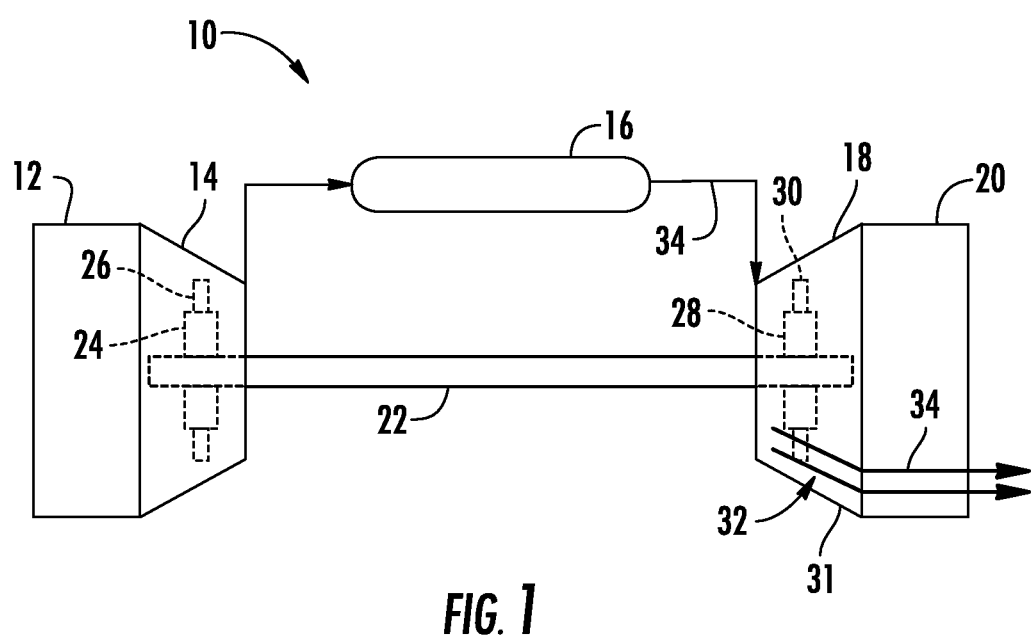
FIG. 1 is a schematic illustration of a turbomachine in accordance with embodiments of the present disclosure.

Reference now will be made in detail to embodiments of the present casting systems and methods, one or more examples of which are illustrated in the drawings. Each example is provided by way of explanation, rather than limitation of, the technology. In fact, it will be apparent to those skilled in the art that modifications and variations can be made in the present technology without departing from the scope or spirit of the claimed technology. For instance, features illustrated or described as part of one embodiment can be used with another embodiment to yield a still further embodiment. Thus, it is intended that the present disclosure covers such modifications and variations as come within the scope of the appended claims and their equivalents.

The word "exemplary" is used herein to mean "serving as an example, instance, or illustration." Any implementation described herein as "exemplary" is not necessarily to be construed as preferred or advantageous over other implementations. Additionally, unless specifically identified otherwise, all embodiments described herein should be considered exemplary.

The detailed description uses numerical and letter designations to refer to features in the drawings. Like or similar designations in the drawings and description have been used to refer to like or similar parts of the invention. As used herein, the terms "first", "second", and "third" may be used interchangeably to distinguish one component from another and are not intended to signify location or importance of the individual components.

The term "fluid" may be a gas or a liquid. The term "fluid communication" means that a fluid is capable of making the connection between the areas specified.

As used herein, the terms "upstream" (or "forward") and "downstream" (or "aft") refer to the relative direction with respect to fluid flow in a fluid pathway. For example, "upstream" refers to the direction from which the fluid flows, and "downstream" refers to the direction to which the fluid flows. However, the terms "upstream" and "downstream" as used herein may also refer to a flow of electricity. The term "radially" refers to the relative direction that is substantially perpendicular to an axial centerline of a particular component, the term "axially" refers to the relative direction that is substantially parallel and/or coaxially aligned to an axial centerline of a particular component and the term "circumferentially" refers to the relative direction that extends around the axial centerline of a particular component.

Terms of approximation, such as "about," "approximately," "generally," and "substantially," are not to be limited to the precise value specified. In at least some instances, the approximating language may correspond to the precision of an instrument for measuring the value, or the precision of the methods or machines for constructing or manufacturing the components and/or systems. In at least some instances, the approximating language may correspond to the precision of an instrument for measuring the value, or the precision of the methods or machines for constructing or manufacturing the components and/or systems. For example, the approximating language may refer to being within a 1, 2, 4, 5, 10, 15, or 20 percent margin in either individual values, range(s) of values and/or endpoints defining range(s) of values. When used in the context of an angle or direction, such terms include within ten degrees greater or less than the stated angle or direction. For example, "generally vertical" includes directions within ten degrees of vertical in any direction, e.g., clockwise or counter-clockwise.

The terms "coupled," "fixed," "attached to," and the like refer to both direct coupling, fixing, or attaching, as well as indirect coupling, fixing, or attaching through one or more intermediate components or features, unless otherwise specified herein. As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Here and throughout the specification and claims, range limitations are combined and interchanged, such ranges are identified and include all the sub-ranges contained therein unless context or language indicates otherwise. For example, all ranges disclosed herein are inclusive of the endpoints, and the endpoints are independently combinable with each other.

Referring now to the drawings, FIG. 1 illustrates a schematic diagram of one embodiment of a turbomachine, which in the illustrated embodiment is a gas turbine 10. Although an industrial or land-based gas turbine is shown and described herein, the present disclosure is not limited to a land-based and/or industrial gas turbine unless otherwise specified in the claims. For example, the invention as described herein may be used in any type of turbomachine including but not limited to a steam turbine, an aircraft gas turbine, or a marine gas turbine.

As shown, gas turbine 10 generally includes an inlet section 12, a compressor section 14 disposed downstream of the inlet section 12, a plurality of combustors (not shown) within a combustor section 16 disposed downstream of the compressor section 14, a turbine section 18 disposed downstream of the combustor section 16, and an exhaust section 20 disposed downstream of the turbine section 18. Additionally, the gas turbine 10 may include one or more shafts 22 coupled between the compressor section 14 and the turbine section 18.

The compressor section 14 may generally include a plurality of rotor disks 24 (one of which is shown) and a plurality of rotor blades 26 extending radially outwardly from and connected to each rotor disk 24. Each rotor disk 24 in turn may be coupled to or form a portion of the shaft 22 that extends through the compressor section 14.

The turbine section 18 may generally include a plurality of rotor disks 28 (one of which is shown) and a plurality of rotor blades 30 extending radially outwardly from and being interconnected to each rotor disk 28. Each rotor disk 28 in turn may be coupled to or form a portion of the shaft 22 that extends through the turbine section 18. The turbine section 18 further includes an outer casing 31 that circumferentially surrounds the portion of the shaft 22 and the rotor blades 30, thereby at least partially defining a hot gas path 32 through the turbine section 18.

During operation, a working fluid such as air flows through the inlet section 12 and into the compressor section 14 where the air is progressively compressed, thus providing pressurized air to the combustors of the combustor section 16. The pressurized air is mixed with fuel and burned within each combustor to produce combustion gases 34. The combustion gases 34 flow through the hot gas path 32 from the combustor section 16 into the turbine section 18, wherein energy (kinetic and/or thermal) is transferred from the combustion gases 34 to the rotor blades 30, causing the shaft 22 to rotate. The mechanical rotational energy may then be used to power the compressor section 14 and/or to generate electricity. The combustion gases 34 exiting the turbine section 18 may then be exhausted from the gas turbine 10 via the exhaust section 20.

Referring now to FIGS. 2 through 9, various views of a casting system 100 for forming a directionally-solidified casting component are illustrated in accordance with embodiments of the present disclosure. As will be explained below in more detail, the directionally-solidified casting component may be formed from molten alloy that solidifies in a mold shell 122. In exemplary implementations, the directionally-solidified casting component may be a turbomachine component (such as a rotor blade, stator vane, fuel nozzle, etc.). For example, the directionally-solidified casting component may be a rotor blade, such that the casting component includes a shank and an airfoil extending from the shank. In this way, the mold shell 122 may define a shank portion 102 and an airfoil portion 104 corresponding with the shape of the shank and airfoil of the turbomachine rotor blade. The casting system 100 may define a cylindrical coordinate system having an axial direction A, a radial direction R extending generally perpendicularly to the axial direction A, and a circumferential direction C extending around the axial direction A.

As shown, the casting system 100 includes a chamber 108 and a baffle plate 110 disposed within the chamber 108. In many embodiments, the chamber 108 may include a bottom 140, a top 142, and a side wall 144 extending between the bottom 140 and the top 142. Additionally, the chamber 108 may define an axial centerline 150. For example, the chamber 108 may be a solid structure that defines an internal volume 112 (i.e., as used herein, the term "chamber" refers to the solid walls that define an internal volume). The baffle plate 110 may separate the internal volume 112 into a heating zone 114 and a cooling zone 116. For example, the chamber 108 and the baffle plate 110 may collectively define the heating zone 114 and a cooling zone 116. The heating zone 114 and the cooling zone 116 may be separated by the baffle plate 110, such that a first side of the baffle plate 110 defines the heating zone 114 and a second side of the baffle plate 110 defines the cooling zone 116. The bottom 140 may partially define the cooling zone 116, and the top 142 may partially define the heating zone 114.

The casting system 100 may further include a cooling plate 118 that is movable (e.g., axially movable) between the heating zone 114 and the cooling zone 116. For example, the cooling plate 118 may be coupled to a shaft 120, and the shaft 120 may be actuatable along the axial direction A (e.g., via one or more linear actuators 301, which are represented by the circled "A"). In various embodiments (not shown), the cooling plate 118 may be a water-cooled cooling plate 118. For example, the cooling plate 118 may have one or more water cooling circuits defined therein, which circulate water through the cooling plate 118. Additionally, in many embodiments, the cooling plate 118 may be composed of a highly thermally conductive material, such as copper or a copper alloy.

The casting system 100 may further include a mold shell 122 disposed on the cooling plate 118 (e.g., disposed on a top surface 119 of the cooling plate 118). For example, the mold shell 122 may extend axially from a base 125 disposed on the cooling plate 118 to a tip 126. The mold shell 122 may define a cavity 128 into which an alloy 162 in a liquid state (i.e., liquid state alloy 164) may be poured in the heating zone 114 (e.g., from the crucible 124). Subsequently, the mold shell 122 may be moved (e.g., by actuating the shaft 120 to move the cooling plate 118 and the mold shell 122 along the axial centerline 150 from the heating zone 114 into the cooling zone 116). As the mold shell 122 is moved into the cooling zone 116, the alloy may solidify to a solid state (i.e., solid state alloy 166) within the mold shell 122 in the axial direction A (i.e., directionally solidify) from the base 125 to the tip 126 of the mold shell 122, thereby forming the directionally-solidified casting component. For example, the alloy 162 may transfer from a liquid state to a solid state as the mold shell 122 is moved from the heating zone 114 and the cooling zone 116. As illustrated, the horizontal dashed lines within the mold shell 122 may represent the alloy 162 in the liquid state (e.g., the liquid state alloy 164), and the cross hatching within the mold shell 122 may represent the alloy 162 in the solid state (e.g., the solid state alloy 166).

a solidification front 130 may form within the mold shell 122 between the alloy 162 in the liquid state and the alloy 162 in the solid state while the mold shell 122 is moved from the heating zone 114 to the cooling zone 116. While the solidification front 130 is illustrated as a line, it should be appreciated that the solidification front 130 may be a range (e.g., an axial range) within the mold shell 122. More particularly, the solidification front 130 may portions of the alloy 162 that are within solidification temperature range. The solidification temperature range may be the range of temperatures where the alloy 162 may transfer from the liquid state to the solid state. Additionally, the alloy 162 at the solidification front 130 (and above) may be above the solidus temperature for the alloy 162. That is, the solidus temperature is the highest temperature at which the alloy 162 is completely solid, and the temperature at the solidification line (and above with respect to the axial direction A) may be greater than the solidus temperature.

In many embodiments, the chamber 108 may be a vacuum chamber which may be evacuated by a vacuum system 132. An electric heating element 134 may be disposed in the heating zone 114 to keep the alloy 162 within the mold shell 122 above the solidus temperature while in the heating zone 114 (e.g., maintain liquid state alloy 164). For example, the electric heating element 134 may surround the mold shell 122 when it is positioned within the heating zone 114. The baffle plate 110 may define an opening 111 through which the cooling plate 118, the shaft 120, and the mold shell 122 move between the heating zone 114 and the cooling zone 116.

To produce a directionally solidified casting component, the mold shell 122 is inserted into the heating zone 114 by moving the shaft 120 axially upward. The liquid state alloy 164 is poured into the mold shell 122 by the crucible 124, and the shaft is then moved axially downward, such that the mold shell 122 passes through the opening 111 from the heating zone 114 to the cooling zone 116. As a result, the alloy 162 transfers from a liquid state to a solid state in the axial direction from the base 125 to the tip 126. For example, the alloy 162 first solidifies at the base 125 of the mold shell 122, and the solidification front moves upward axially to the tip 126 of the mold shell 122.

Due to the geometric complexity of the directionally-solidified casting component, various portions of the alloy 162 within the mold shell 122 may not solidify at the same rate (e.g., some portions may solidify slower than others), which may result in one or more component defects. As such, the exemplary casting system 100 described herein includes a cooling system 200 for directing a coolant fluid 201 towards the mold shell 122 (e.g., within the cooling zone 116), thereby increasing the solidification rate of the alloy to prevent defects from forming.

The cooling system 200 may include a coolant fluid supply 202 and a coolant fluid supply line 204. The coolant fluid supply 202 may be a container, tank, or other coolant fluid reservoir. The coolant fluid supply line 204 may convey coolant fluid 201 from the coolant fluid supply 202 into the cooling zone 116 to be directed towards the mold shell 122. In exemplary implementations, the coolant fluid 201 may be a fluid that will not react with the alloy 162. For example, in exemplary embodiments, the coolant fluid 201 may be an inert or noble gas, such as helium or argon. The coolant fluid 201 introduced to the chamber (e.g., to the cooling zone of the chamber 108) may be subsequently evacuated by the vacuum system 132. For example, the vacuum system 132 may continuously remove (or evacuate) the coolant fluids 201 as they are introduced in the cooling zone 116 to maintain the vacuum in the chamber 108.

Figure 2:
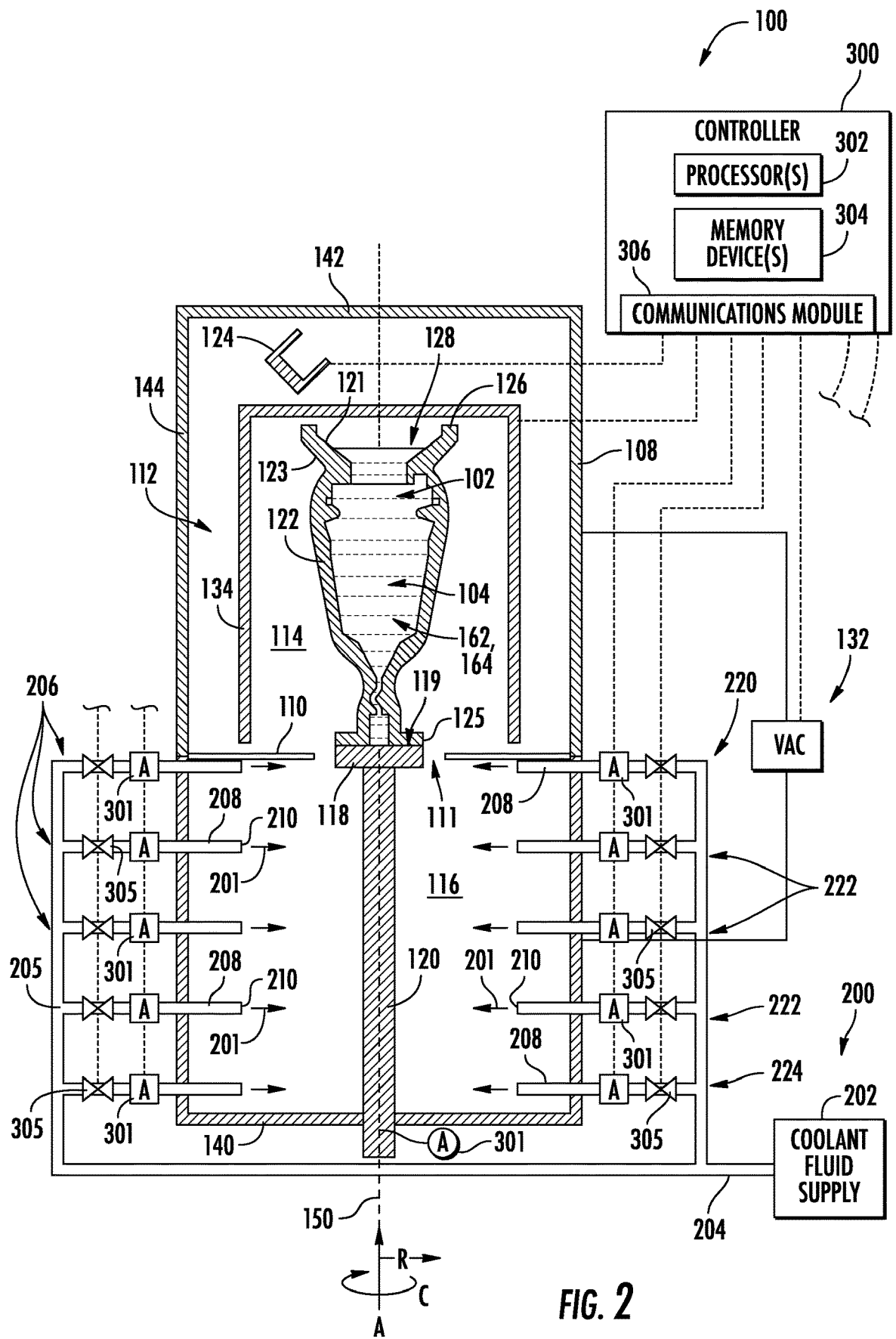
FIG. 2 illustrates a cross-sectional view of a casting system in a first position in accordance with embodiments of the present disclosure.
Figure 3:
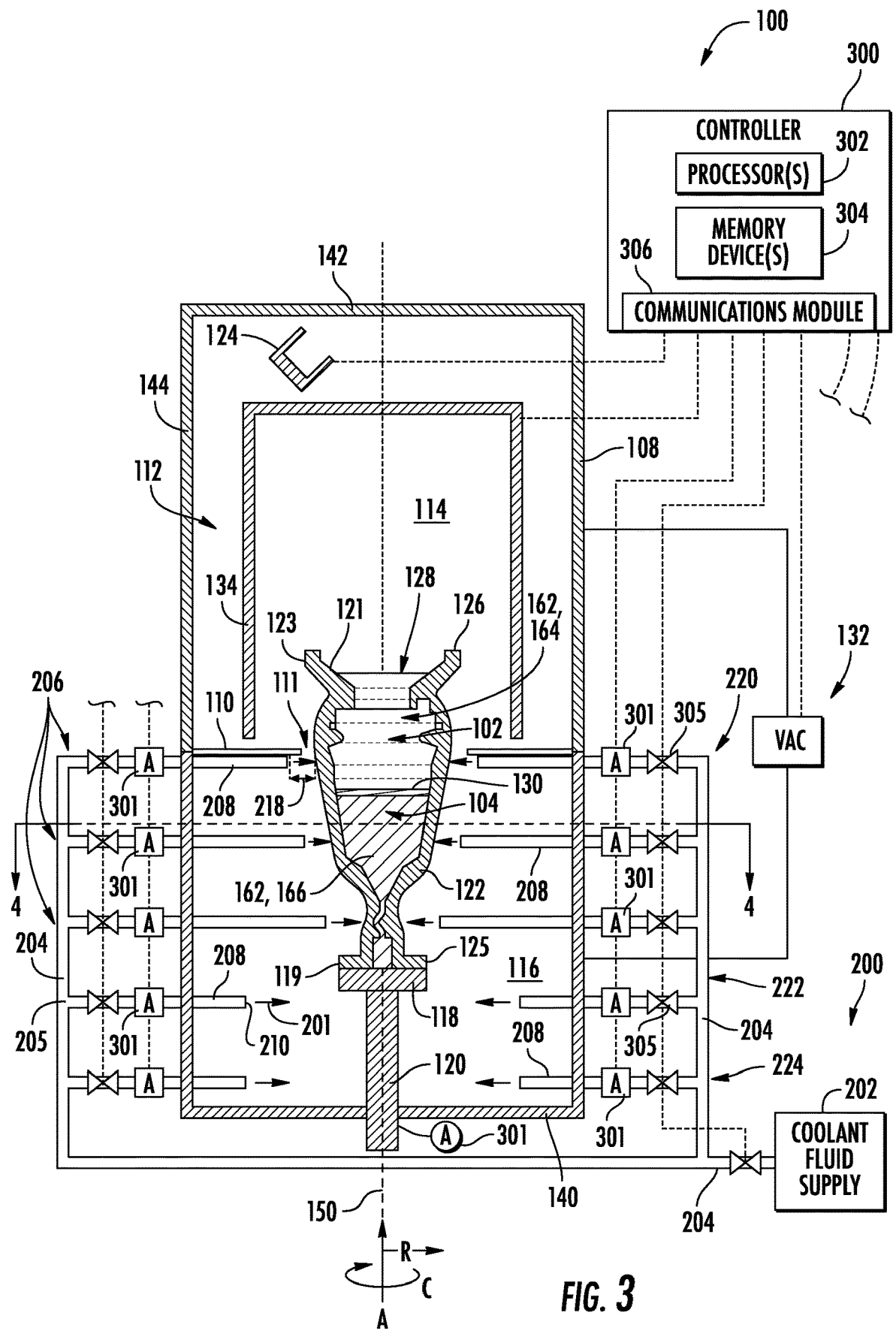
FIG. 3 illustrates a cross-sectional view of the casting system shown in FIG. 2 in a second position in accordance with embodiments of the present disclosure.
Figure 4:
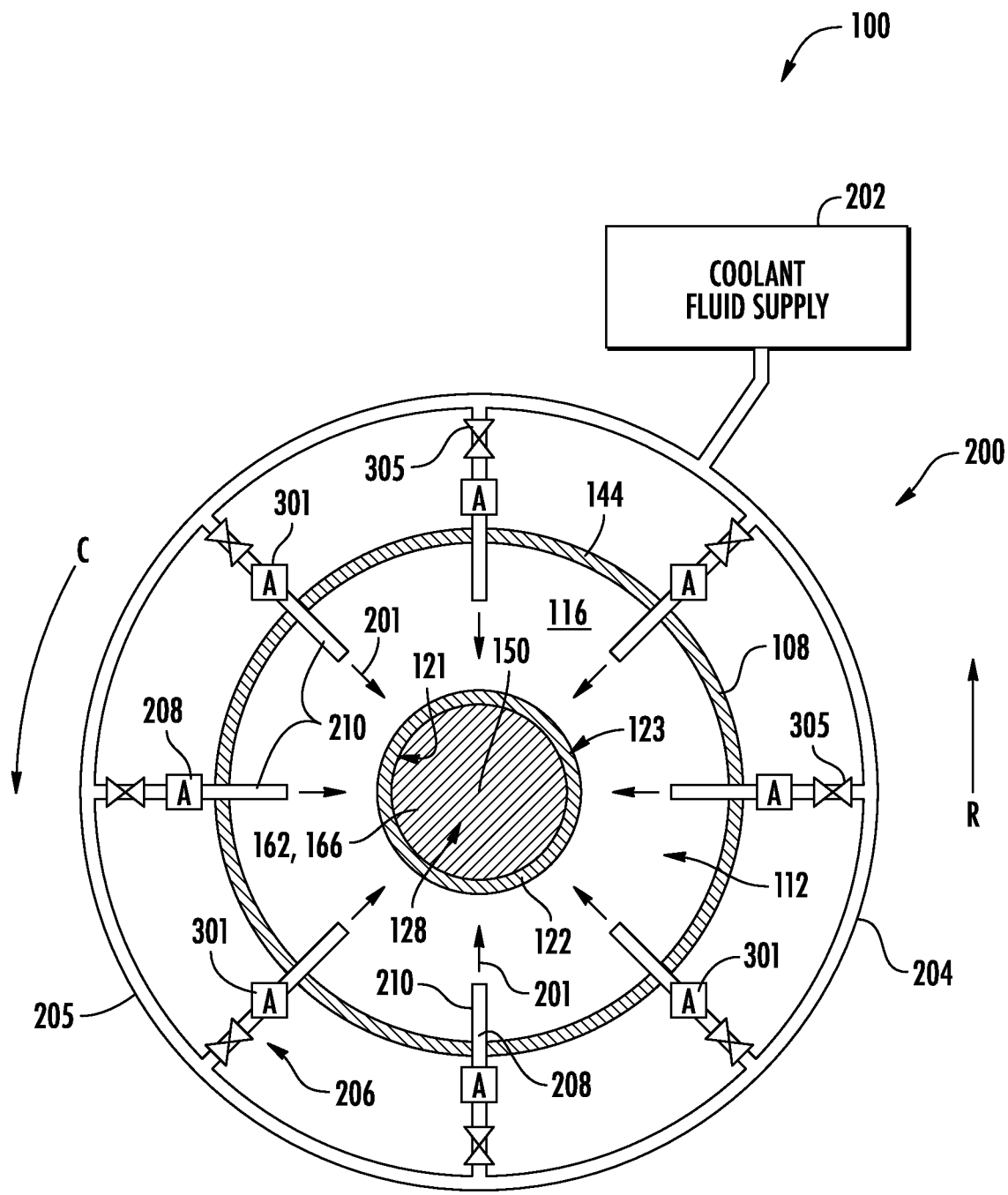
FIG. 4 illustrates a cross-sectional view of the casting system shown in FIG. 3 from along the line 4-4.
Figure 5:
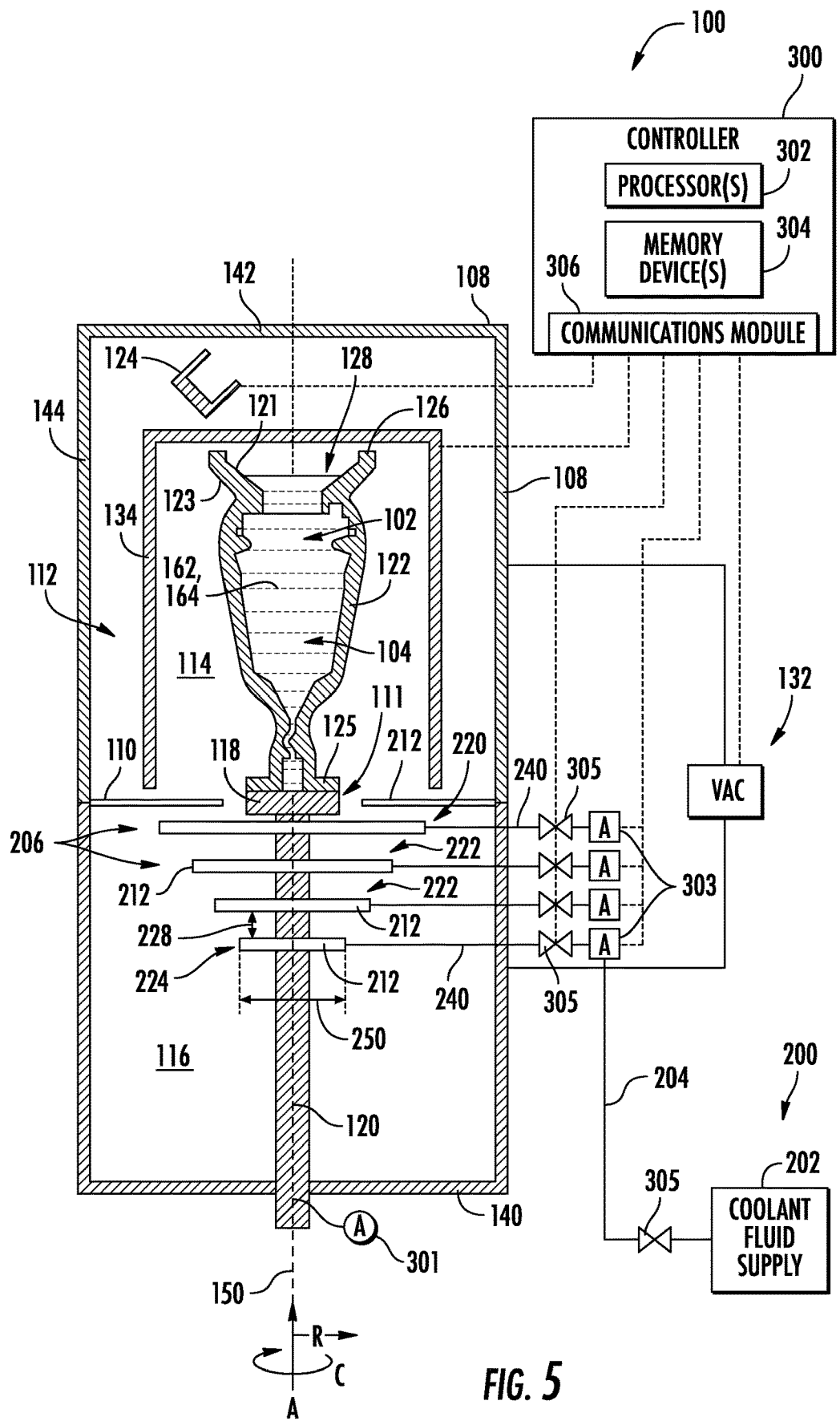
FIG. 5 illustrates a cross-sectional view of a casting system in a first position in accordance with embodiments of the present disclosure.
Figure 6:
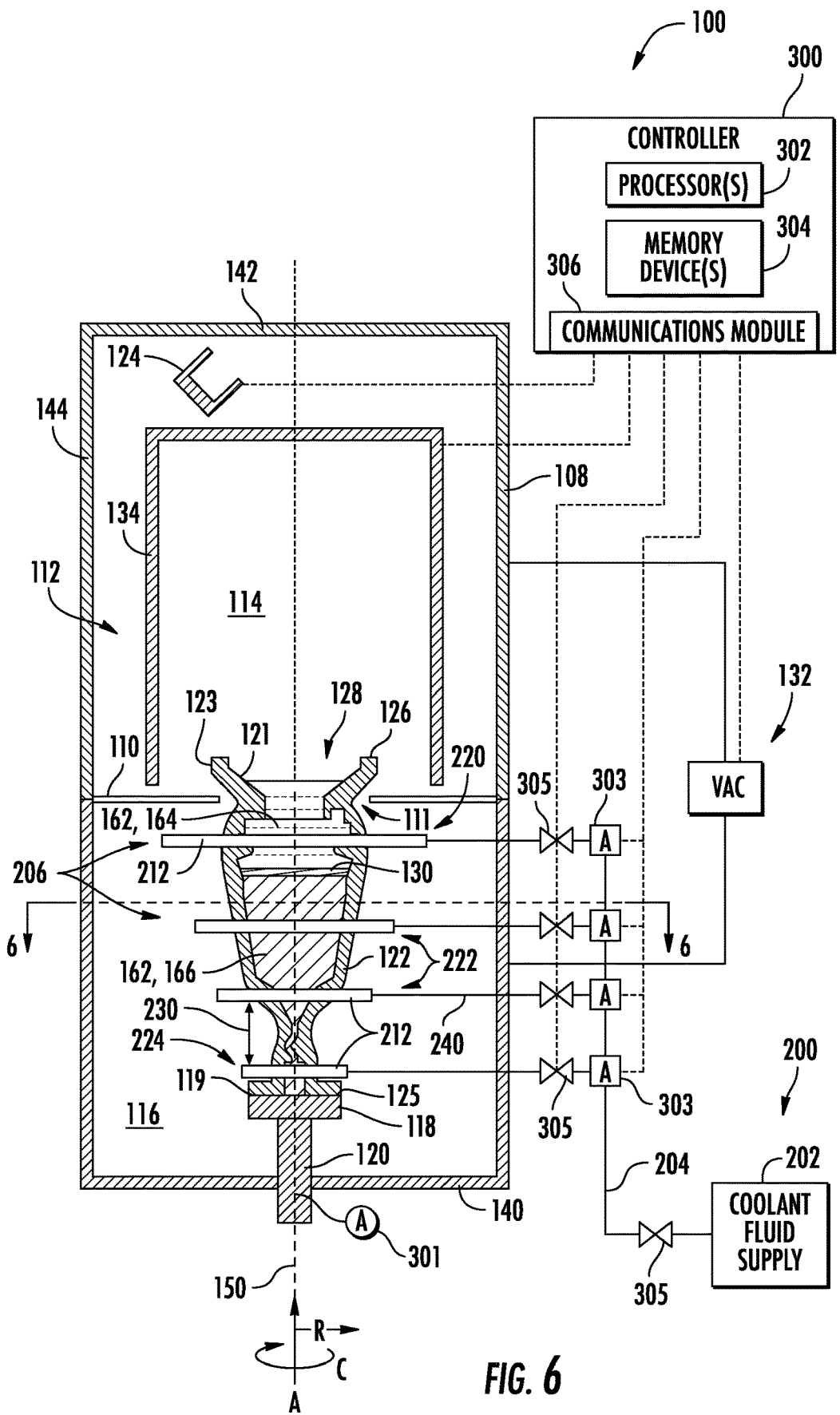
FIG. 6 illustrates a cross-sectional view of the casting system shown in FIG. 5 in a second position in accordance with embodiments of the present disclosure.
Figure 7:
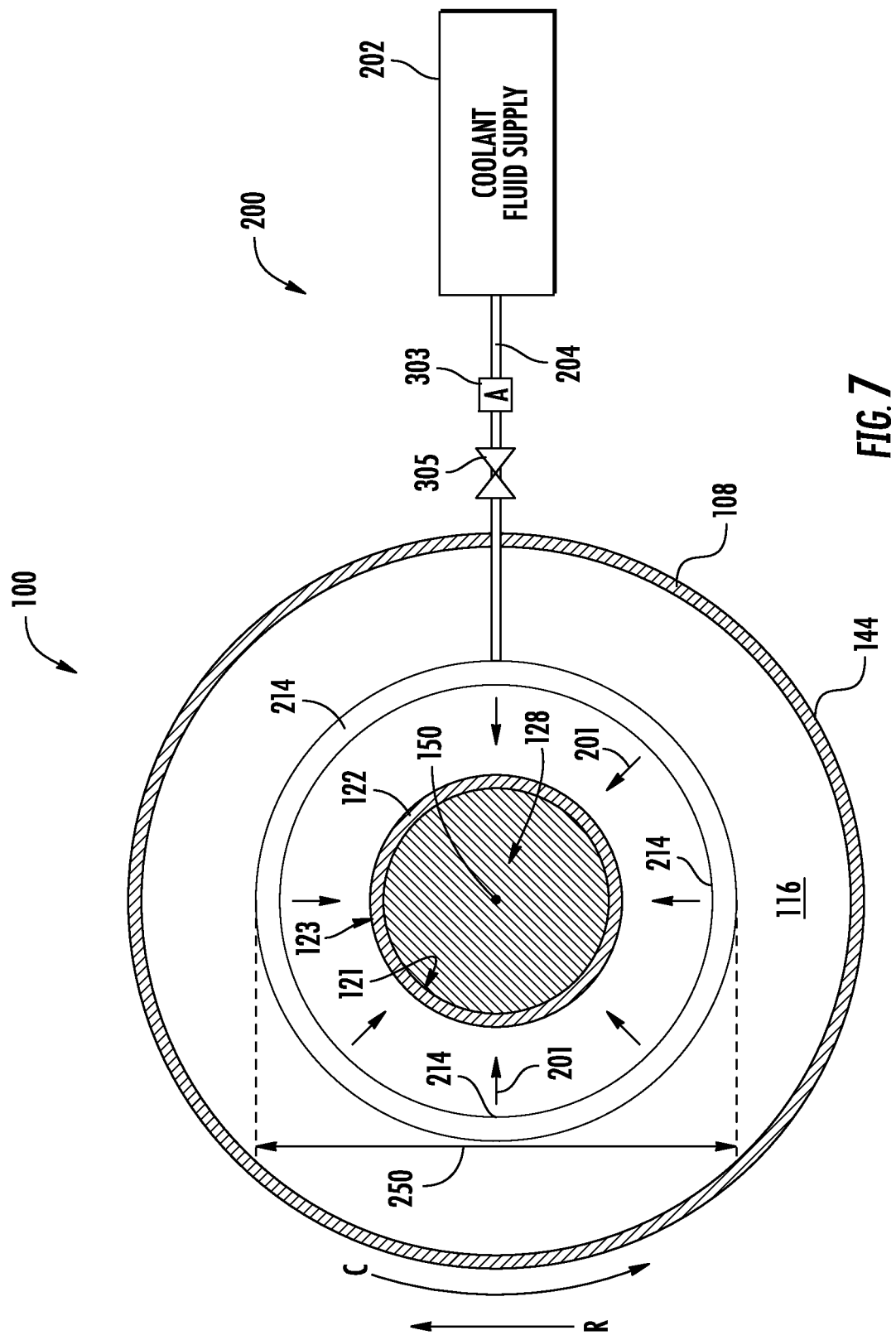
FIG. 7 illustrates a cross-sectional view of the casting system shown in FIG. 3 from along the line 7-7.

In many embodiments, as shown in FIGS. 2 through 7, the cooling system 200 may include a plurality of ejection devices 206 axially spaced apart from one another. The plurality of ejection devices 206 may be disposed in the cooling zone 116 (e.g., axially between the baffle plate 110 and the bottom 140). Each ejection device 206 may be in fluid communication with the coolant fluid supply 202 via the coolant fluid supply line 204 (i.e., the coolant fluid supply line 204 may fluidly couple each ejection device 206 to the coolant fluid supply 202. The plurality of ejection devices 206 may eject (or inject) the coolant fluid 201 towards the mold shell 122. For example, in some embodiments, as shown in FIGS. 2 through 4, the ejection devices 206 may include a plurality of nozzles 208 each extending radially to an outlet 210. Alternatively, or additionally, as shown in FIGS. 5 through 7, the ejection devices 206 may each include a ring 212 that surrounds the mold shell 122 and defines a plurality of outlets 214. In both embodiments, the ejection device 206 may define outlets that are sized and oriented to direct the coolant fluid 201 in discrete jets to impinge upon the mold shell 122 (e.g., an exterior surface 123 of the mold shell). The discrete jets of coolant fluid 201 may impinge (or strike) the exterior surface 123 of the mold shell 122, which allows for heat transfer from the alloy 162 to the coolant fluid 201. Once the discrete jets of coolant fluid 201 have impinged upon the mold shell 122, they may be referred to as "post-impingement fluid" and/or "spent cooling fluid" because the coolant fluid 201 has undergone an energy transfer and therefore has different characteristics (e.g., higher temperature and lower pressure than prior to impingement). The spent cooling fluid may be evacuated from the cooling zone 116 via the vacuum system 132.

Referring now to FIGS. 2 through 4, various views of a casting system 100 are illustrated in accordance with embodiments of the present disclosure. For example, FIG. 2 illustrates a cross-sectional view of the casting system 100 in a first position (e.g., a heating position), FIG. 3 illustrates the casting system 100 in a second position (e.g., during the withdrawing stage), and FIG. 4 illustrates a cross-sectional view of the casting system 100 from along the line 4-4 shown in FIG. 3.

As shown in FIGS. 2 through 4, the cooling system 200 may include a coolant fluid supply 202, a plurality of axially spaced ejection devices 206, and a coolant fluid supply line 204 extending between the coolant fluid supply 202 and the plurality of ejection devices 206. Each ejection device 206 may include a plurality of nozzles 208 that extend towards the mold shell 122. For example, each nozzle 208 of the plurality of nozzles 208 may extend generally radially from the coolant fluid supply line 204, through the chamber 108, to an outlet 210 within the cooling zone 116.

In exemplary embodiments, as shown by comparing FIGS. 2 and 3, each nozzle 208 of the plurality of nozzles 208 is movable in the radial direction R to adjust a radial gap 218 between an outlet 210 of the nozzle 208 and an exterior surface 123 of the mold shell 122. For example, each nozzle 208 may be at least partially formed from a flexible conduit or hose, such that the nozzle 208 may be extended and/or retracted radially. For example, in many embodiments, each nozzle 208 of the plurality of nozzles 208 may include an actuator 301 in operable communication with a controller 300. The actuator 301 may be operable to adjust a radial position of the nozzle 208, e.g., the actuator may extend and/or retract the nozzle 208 such that a radial position of the outlet 210 is modified. The outlet 210 of each nozzle 208 may be radially movable between the side wall 144 of the chamber 108 and the axial centerline 150 of the chamber 108. As should be appreciated, the radial gap 218 may impact the effectiveness of impingement cooling because, when the coolant fluid 201 has a shorter distance to travel across, the coolant fluid 201 will have a higher velocity thereby removing more heat from the mold shell 122. As such, in exemplary embodiments, each nozzle 208 can be selectively actuated such that the radial gap 218 is modified based on cooling needs. For example, if more cooling is required at a particular axial location of the mold shell 122, then the nozzle 208 at the axial location may be actuated to shorten the radial gap 218, thereby increasing the effectiveness of the impingement cooling due to the increased velocity of the coolant fluid 201 striking the surface of the mold shell 122.

Additionally, in many embodiments, each nozzle of the plurality of nozzles may include a valve 305 in operable communication with the controller 300. Each valve 305 may be fluidly coupled to a respective nozzle 208 of the plurality of nozzles 208. The valves 305 may be actuated between an open position and a closed position. In the open position, coolant fluid may be permitted to pass through the valve 305, and in the closed position, the coolant fluid may be blocked or otherwise restricted from flowing through the valve 305. As such, in many embodiments, the controller 300 may selectively open/close one or more valves 305 based the cooling needs of the alloy 162 within the mold shell 122. For example, while the mold shell 122 is being moved from the heating zone 114 to the cooling zone 116, one or more valves 305 may be in a closed position until at least a portion of the mold shell 122 is moved into an axial-circumferential plane of the nozzles 208 to which the one or more valves 305 are fluidly coupled. At which point, the one or more valves 305 may be switched (or actuated) from the closed position into the open position when the mold shell 122 is moved into the axial-circumferential plane of the nozzles 208 to which the one or more valves 305 are fluidly coupled.

As shown in FIG. 4, the coolant fluid supply line 204 may further comprise a ring portion 205 that surrounds the chamber 108. For example, each nozzle 208 of the plurality of nozzles 208 may extend generally radially from the ring portion 205 to a respective outlet 210. Additionally, as shown in FIG. 4, the plurality of nozzles 208 may be circumferentially spaced apart from one another (e.g., equally circumferentially spaced apart).

The plurality of ejection devices 206 may be axially spaced apart from one another. For example, the cooling system 200 may include an initial ejection device 220 proximate (or near) the baffle plate 110, a final ejection device 224 proximate (or near) the bottom 140, and a plurality of intermediate ejection devices 222 positioned between the initial ejection device 220 and the final ejection device 224. In the embodiment shown in FIGS. 2 and 3, the plurality of ejection devices 206 may be configured as a plurality of radially movable nozzles 208 extending through the chamber 108.

In other embodiments, as shown in FIGS. 5 through 7, the plurality of ejection devices 206 may each be configured as a ring 212 that is axially movable and positioned within the cooling zone 116. In operation, when the mold shell 122 is moved axially from the heating zone 114 to the cooling zone 116, the mold shell 122 may travel axially through, in this order, the opening 111, the initial ejection device 220, the plurality of intermediate ejection devices 222, and the final ejection device 224 until the cooling plate 118 reaches the bottom 140.

The ring 212 of each ejection device 206 may be movable in the axial direction A within the cooling zone 116 between the baffle plate 110 and the bottom 140. For example, FIG. 5 illustrates the casting system 100 in a first position, e.g., before the mold shell 122 is moved into the cooling zone. FIG. 6 illustrates the casting system 100 in a second position, e.g., while the mold shell 122 is being moved into the cooling zone 116. For example, the shaft 120 may move the mold shell 122 through the opening 111 and into the cooling zone 116 such that the rings 212 surround the mold shell 122 in the cooling zone 116. The rings 212 may move from a first position (FIG. 5) in which the rings 212 are disposed a first axial distance 228 away from one another and proximate the baffle plate 110 to a second position (FIG. 6) in which the rings 212 are positioned a second axial distance 230 away from one another. The second axial distance 230 may be larger than the first axial distance 228. Additionally, in the first position (FIG. 5) all of the rings 212 may be positioned closer to the baffle plate 110 than the bottom 140, which advantageously provides increased cooling to the mold shell 122 immediately upon traveling through the opening 111 and into the cooling zone 116. Once the base 125 of the mold shell 122 is withdrawn (or moved) axially beyond the final ring 212 (i.e., the bottom-most ring 212), then the rings 212 may begin moving axially with the mold shell 122 until the mold shell 122 is fully disposed within the cooling zone 116.

Each ring 212 may be in fluid communication with the coolant fluid supply line 204 via a branch 240. For example, each branch 240 may extend between the coolant fluid supply line 204 and a ring 212. A valve 305 may be fluidly coupled to each branch 240. In various embodiments, each ring 212 may be coupled to an actuator 303 that can modify an axial position of the ring 212. For example, the actuator 303 may be disposed on each branch 240 (e.g., at a junction between the branch 240 and the coolant fluid supply line 204.) In many embodiments, each actuator 303 may be in operable communication with a controller 300. For example, each actuator may be operable to adjust an axial position of the ring 212, e.g., the actuator may extend and/or retract to adjust the axial position of each ring 212 within the cooling zone 116. Each ring 212 may be axially movable between the baffle plate 110 and the bottom 140.

As shown in FIG. 7, each ring 212 may surround the mold shell 122 and define a plurality of outlets 214. The plurality of outlets 214 may be defined on the inner portion of the ring 212 and may be circumferentially spaced apart from one another. In some embodiments, as shown, the ring 212 may be shaped as a circle. In other embodiments, the ring 212 may have other shapes, such as an oval or others. Particularly, in many embodiments, each ring 212 may correspond in cross-sectional shape with the mold shell 122, such that the ring 212 may define a uniform radial gap between the outlets 214 and the portion of the mold shell 122 that is to be cooled by the coolant fluid 201. Additionally, the plurality of outlets 214 may be oriented towards the mold shell 122.

In many embodiments, the ring 212 of each ejection device 206 may define a diameter 250, and the diameter 250 of each ring 212 may be different (particularly the internal diameter of each ring 212 may be different). For example, the ring 212 of a first ejection device 206 of the plurality of ejection devices 206 may define a first diameter, and the ring 212 of a second ejection device 206 of the plurality of ejection devices 206 may define a second diameter. The first diameter and the second diameter may be different. Particularly, as shown in FIGS. 5 and 6, the diameter of the ring 212 of each ejection device 206 may be different. For example, the diameter of the ring of the initial ejection device 220, the diameter of the ring of each intermediate ejection devices 222, and the diameter of the ring of the final ejection device 224 may be different, which advantageously maintains a desired radial gap between the mold shell 122 and the outlets 214 of the ring 212.

Figure 8:
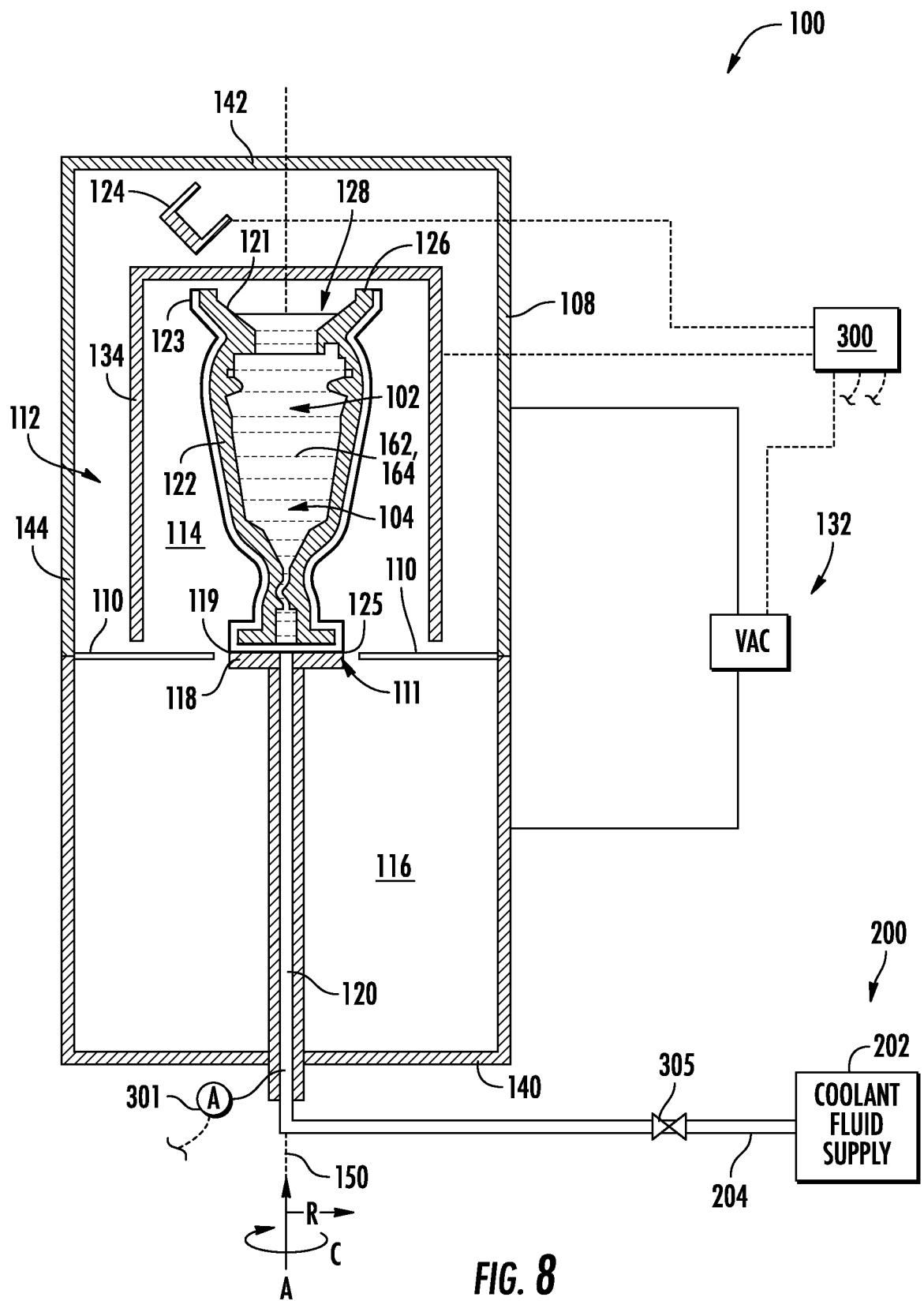
FIG. 8 illustrates a cross-sectional view of a casting system in a first position in accordance with embodiments of the present disclosure.
Figure 9:
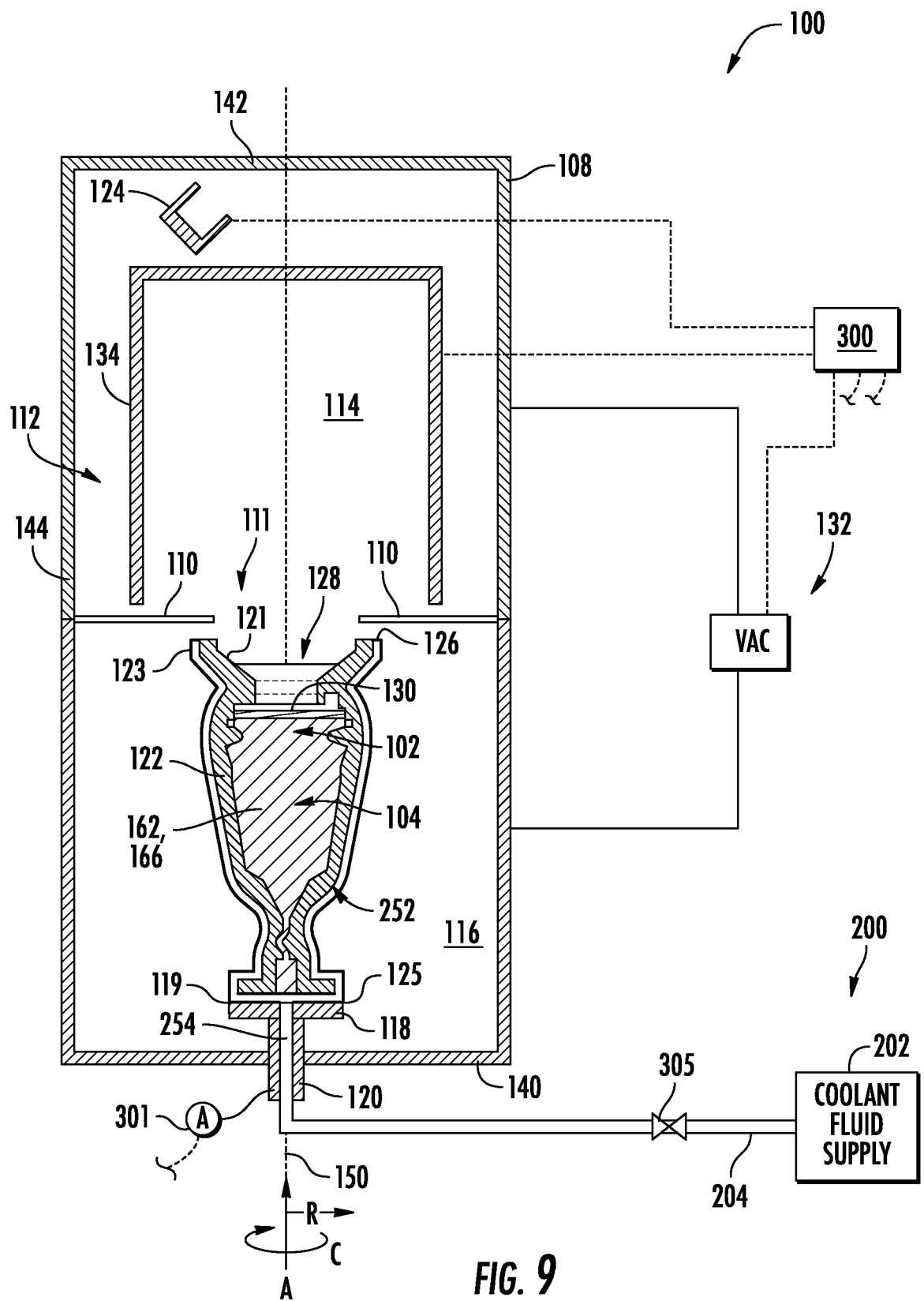
FIG. 9 illustrates a cross-sectional view of the casting system shown in FIG. 8 in a second position in accordance with embodiments of the present disclosure.

Referring now to FIGS. 8 and 9, a casting system 100 is illustrated in accordance with another embodiment of the present disclosure. For example, FIG. 8 illustrates a cross-sectional view of the casting system 100 in a first position, and FIG. 9 illustrates a cross-sectional view of the casting system shown in FIG. 8 in a second position in accordance with embodiments of the present disclosure.

As shown in FIGS. 8 and 9, the mold shell 122 may define a cooling circuit 252. For example, the cooling circuit 252 may be defined between the exterior surface 123 and the interior surface 121 of the mold shell 122. The cooling circuit 252 may be in fluid communication with the cooling system 200. For example, the cooling system 200 may include a passage 254 defined in the shaft 120 and the cooling plate 118. For example, the passage 254 may extend from an inlet disposed in the shaft 120 to an outlet disposed in a top surface 119 of the cooling plate 118. The coolant fluid supply line 204 may be fluidly coupled to the inlet of the passage 254 (e.g., the coolant fluid supply line 204 may extend between the coolant fluid supply 202 and the inlet of the passage 254. The passage 254 may be fluidly coupled to the cooling circuit 252 of the mold shell 122. For example, the base 125 of the mold shell 122 may define an inlet to the cooling circuit 252 that is fluidly coupled to the outlet of the passage 254.

As shown in FIGS. 2 through 9, the casting system 100 may further include a controller 300, which is illustrated as a block diagram to show the suitable components that may be included within the controller 300. As shown, the controller 300 may include one or more processor(s) 302 and associated memory device(s) 304 configured to perform a variety of computer-implemented functions (e.g., performing the methods, steps, calculations and the like and storing relevant data as disclosed herein). Additionally, the controller 300 may also include a communications module 306 to facilitate communications between the controller 300 and the various components of the casting system 100, such as the crucible 124, the shaft 120, the vacuum system 132, the electric heating element 134, the actuator(s) 301, 303, and/or the valves 305. For example, the communications module 306 may be in communication with the actuator(s) 301, 303, in order to allow the processor 302 to selectively move plurality of nozzles 208 (FIGS. 2-4) or the rings 212 (FIGS. 5-7). It should be appreciated that the crucible 124, the shaft 120, the vacuum system 132, the electric heating element 134, actuator(s) 301, 303, and the valves 305 may be communicatively coupled to the communications module 306 using any suitable means (e.g., a wired connection or a wireless connection using any suitable wireless communications protocol known in the art).

As used herein, the term "processor" refers not only to integrated circuits referred to in the art as being included in a computer, but also refers to a controller, a microcontroller, a microcomputer, a programmable logic controller (PLC), an application specific integrated circuit, and other programmable circuits. Additionally, the memory device(s) 304 may generally comprise memory element(s) including, but not limited to, computer readable medium (e.g., random access memory (RAM)), computer readable non-volatile medium (e.g., a flash memory), a floppy disk, a compact disc-read only memory (CD-ROM), a magneto-optical disk (MOD), a digital versatile disc (DVD) and/or other suitable memory elements. Such memory device(s) 304 may generally be configured to store suitable computer-readable instructions that, when implemented by the processor(s) 302, configure the system 100 to perform various functions and/or operations including, but not limited to, pouring, with the crucible 124, an alloy 162 in a liquid state into the mold shell 122; moving, with the shaft 120, the mold shell 122 from the heating zone 114 into the cooling zone 116; and directing a coolant fluid 201 towards the mold shell 122 with the cooling system 200.

Figure 10:
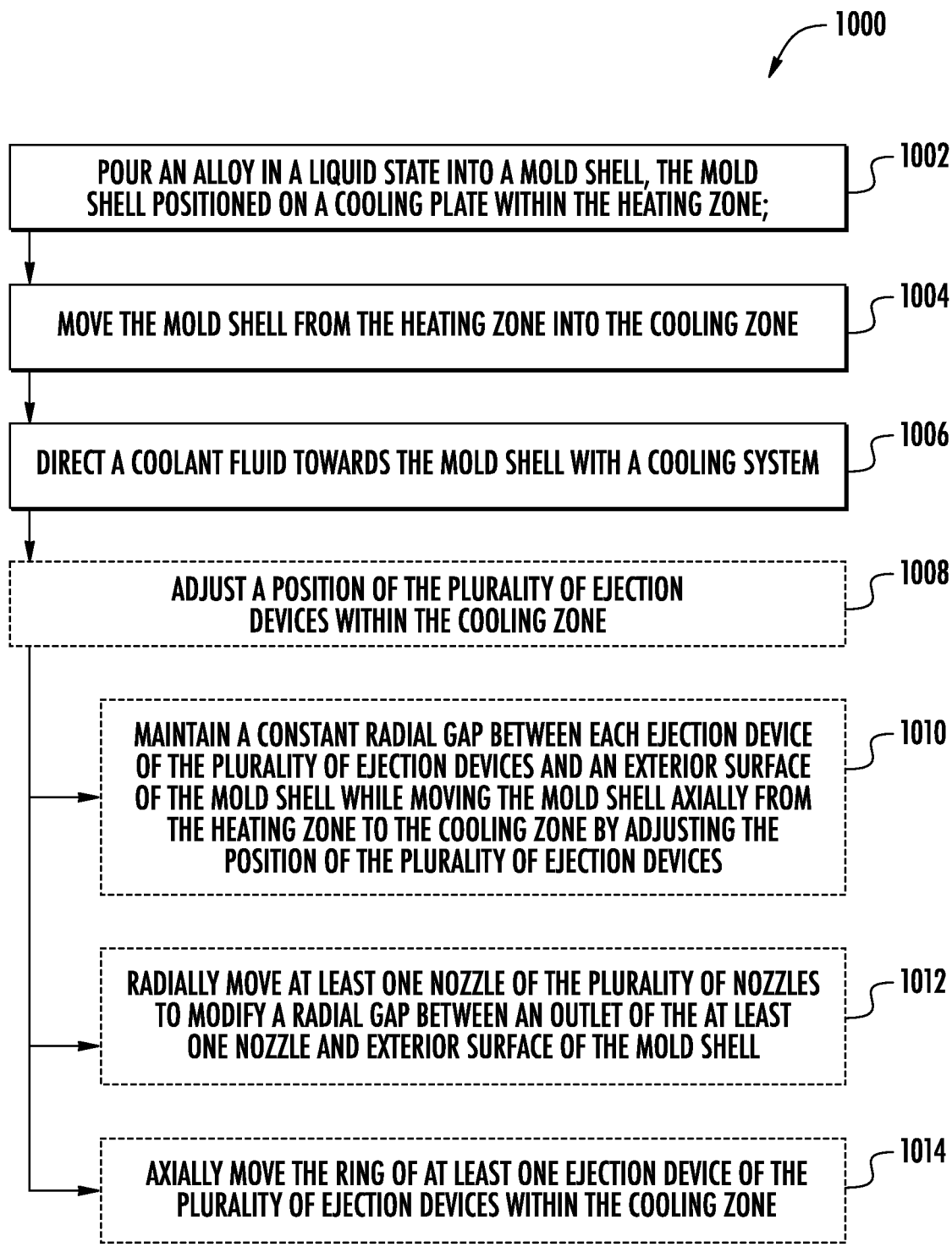
FIG. 10 is a flow diagram of one embodiment of a method of forming a directionally-solidified casting component using a casting system in accordance with embodiments of the present disclosure.

Referring now to FIG. 10, a flow diagram of one embodiment of a method 1000 of forming a directionally-solidified casting component using a casting system 100 is illustrated in accordance with aspects of the present subject matter. In general, the method 1000 will be described herein with reference to the casting system 100 and the gas turbine 10 described above with reference to FIGS. 1 through 9. However, it will be appreciated by those of ordinary skill in the art that the disclosed method 1000 may generally be utilized in connection with any casting system having any other suitable system configuration. In addition, although FIG. 10 depicts steps performed in a particular order for purposes of illustration and discussion, the methods discussed herein are not limited to any particular order or arrangement unless otherwise specified in the claims. One skilled in the art, using the disclosures provided herein, will appreciate that various steps of the methods disclosed herein can be omitted, rearranged, combined, and/or adapted in various ways without deviating from the scope of the present disclosure.

As shown in FIG. 10, the method 1000 may include at (1002) pouring an alloy 162 in a liquid state into a mold shell 122. The mold shell 122 may be positioned on a cooling plate 118 within the heating zone 114. Prior to pouring at (1002) the alloy 162 may be heated in the crucible 124 to a molten or liquid state, and once the alloy 162 is in a liquid state, the alloy 162 may be poured by the crucible 124 into the mold shell 122. For example, the alloy 162 may be poured through an opening at the tip 126 of the mold shell 122 into the cavity 128 defined by the mold shell 122, such that the alloy 162 fills the cavity 128 defined by the mold shell 122. The cavity 128 may correspond in shape with the directionally solidified casting component, such that the cavity 128 may have a rotor blade shape having a shank portion 102 and an airfoil portion 104.

In many implementations, either prior to the pouring step or after the pouring step, the method 1000 may further include evacuating the chamber 108 with a vacuum system 132. The vacuum system 132 may remove all the air from the chamber 108, thereby creating a vacuum. Additionally, in some implementations, when the mold shell 122 is within the heating zone 114 (e.g., during the pouring step and/or after the pouring step), an electric heating element 134 may heat the alloy 162 within the mold shell 122 to keep or maintain the alloy 162 in the liquid state.

In various implementations, the method 1000 may further include at (1004) moving the mold shell 122 from the heating zone 114 into the cooling zone 116. As a result, the alloy 162 transfers from the liquid state to a solid state within the mold shell 122 while moving the mold shell 122 from the heating zone 114 to the cooling zone 116. Moving at (1004) may include actuating the shaft 120 (e.g., by sending a signal with the controller 300) to translate the shaft 120 in the axial direction A, thereby moving the mold shell 122 through the opening 111 in the baffle plate 110 from the heating zone 114 into the cooling zone 116.

In exemplary implementations, the method 1000 may further include at (1006) directing a coolant fluid 201 towards the mold shell 122 with the cooling system 100. For example, directing at (1006) may include ejecting (or injecting) the coolant fluid 201 in discrete jets from an ejection device 206 positioned within the cooling zone 116 towards the exterior surface 123 of the mold shell 122. Additionally, or alternatively, directing at (1006) may be performed during moving step 1004. For example, the coolant fluid 201 may be directed towards the mold shell 122 while moving the mold shell 122 axially from the heating zone 114 to the cooling zone 116. In many embodiments, the cooling system 100 may include a plurality of ejection devices 206 that are axially spaced apart from one another and that are movable within the cooling zone 116 (e.g., movable in the axial direction A and/or the radial direction R).

In optional embodiments, as shown in FIG. 10 the method 1000 may include at (1008) adjusting a position of the plurality of ejection devices 206 within the cooling zone 116. For example, the plurality of ejection devices 206 may be moved axially and/or radially within the cooling zone 116 while the mold shell 122 is being moved from the heating zone 114 to the cooling zone 116.

In various embodiments, adjusting at (1008) may further include at (1010) maintaining a constant radial gap between each ejection device 206 of the plurality of ejection devices 206 and an exterior surface 123 of the mold shell 122 while moving the mold shell 122 axially from the heating zone 114 to the cooling zone 116 by adjusting the position of the plurality of ejection devices 206. For example, each ejection device 206 may be moved axially and/or radially while the mold shell 122 is moved axially to maintain the constant radial gap. In various implementations, the constant radial gap may be between an outlet (e.g., outlet 210 in FIGS. 2-4 or outlet 214 in FIG. 7) of the ejection device 206 and the exterior surface 123 of the mold shell 122. The ejection device 206 may be moved axially at the same speed as the mold shell 122, at a greater speed, or at a slower speed than the mold shell 122 while the mold shell 122 is being withdrawn from the heating zone 114.

In many embodiments, as described above, the plurality of ejection devices may include a plurality of nozzles 208 extending radially towards the mold shell 122. In such embodiments, the method may further include, at (1012), radially moving at least one nozzle 208 of the plurality of nozzles 208 to modify a radial gap 218 between an outlet 210 of the at least one nozzle 208 and an exterior surface 123 of the mold shell 122. The outlet 210 of each nozzle 208 may be moved radially within an envelope that corresponds with the exterior shape of the mold shell 122 while the mold shell 122 is being withdrawn to maintain a constant radial gap between the outlet 210 and the exterior surface 123 of the mold shell 122.

In other embodiments, each ejection device 206 of the plurality of ejection devices 206 may include a ring 212 that surrounds the mold shell 122 and defines a plurality of outlets 214. In such embodiments, the method may further include, at (1014), axially moving the ring 212 of at least one ejection device 206 of the plurality of ejection devices 206 within the cooling zone 116. The rings 212 may move from a first position (FIG. 5) in which the rings 212 are disposed a first axial distance 228 away from one another and proximate the baffle plate 110 to a second position (FIG. 6) in which the rings 212 are positioned a second axial distance 230 away from one another. The second axial distance 230 may be larger than the first axial distance 228. Additionally, in the first position (FIG. 5) all of the rings 212 may be positioned closer to the baffle plate 110 than the bottom 140, which advantageously provides increased cooling to the mold shell 122 immediately upon traveling through the opening 111 and into the cooling zone 116. Once the base 125 of the mold shell 122 is withdrawn (or moved) axially beyond the final ring 212 (i.e., the bottom-most ring 212), then the rings 212 may begin moving axially with the mold shell 122 until the mold shell 122 is fully disposed within the cooling zone 116.

In many embodiments, the mold shell 122 may define a cooling circuit 252 (e.g., between an exterior surface and an interior surface of the mold shell 122). In such embodiments, the method 1000 may further include directing the coolant fluid 201 through a passage 254 defined in the cooling plate 118 and the shaft 120 attached to the cooling plate 118 to the cooling circuit 252 defined in the mold shell 122.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal language of the claims.

Further aspects of the invention are provided by the subject matter of the following clauses:

A casting system for forming a directionally-solidified casting component, the casting system defining an axial direction, a radial direction, and a circumferential direction, the casting system comprising: a chamber; a baffle plate disposed within the chamber, the chamber and the baffle plate collectively defining a heating zone and a cooling zone, the heating zone and the cooling zone separated by the baffle plate; a shaft; a cooling plate disposed on the shaft and movable between the heating zone and the cooling zone; a mold shell disposed on the cooling plate; and a cooling system for directing a coolant fluid towards the mold shell.

The casting system as in any of the preceding clauses, wherein the cooling system comprises a plurality of ejection devices axially spaced apart from one another.

The casting system as in any of the preceding clauses, wherein each ejection device of the plurality of ejection devices comprises a plurality of nozzles extending towards the mold shell.

The casting system as in any of the preceding clauses, wherein each nozzle of the plurality of nozzles is movable in the radial direction to adjust a radial gap between an outlet of the nozzle and an exterior surface of the mold shell.

The casting system as in any of the preceding clauses, wherein each nozzle of the plurality of nozzles includes an actuator and a valve in operable communication with a controller.

The casting system as in any of the preceding clauses, wherein each ejection device of the plurality of ejection devices comprises a ring that surrounds the mold shell and defines a plurality of outlets.

The casting system as in any of the preceding clauses, wherein the ring of each ejection device is movable in the axial direction within the cooling zone.

The casting system as in any of the preceding clauses, wherein the ring of a first ejection device of the plurality of ejection devices defines a first diameter, wherein the ring of a second ejection device of the plurality of ejection devices defines a second diameter, and wherein the first diameter and the second diameter are different.

The casting system as in any of the preceding clauses, wherein the mold shell defines a cooling circuit, the cooling circuit in fluid communication with the cooling system.

The casting system as in any of the preceding clauses, wherein the cooling system includes passage defined in the shaft and the cooling plate, the passage being fluidly coupled to the cooling circuit of the mold shell.

The casting system as in any of the preceding clauses, wherein the cooling system further comprises a coolant supply and a coolant fluid supply line.

A method of forming a directionally-solidified casting component using a casting system, the casting system comprising a chamber having a heating zone and a cooling zone separated by a baffle plate, the method comprising: pouring an alloy in a liquid state into a mold shell, the mold shell positioned on a cooling plate within the heating zone; moving the mold shell from the heating zone into the cooling zone, whereby the alloy transfers from the liquid state to a solid state within the mold shell while moving the mold shell from the heating zone to the cooling zone; and directing a coolant fluid towards the mold shell with a cooling system.

The method as in any of the preceding clauses, wherein the casting system defines an axial direction, a radial direction, and a circumferential direction, wherein the cooling system further comprises a plurality of ejection devices axially spaced apart from one another, and wherein the method further comprises: adjusting a position of the plurality of ejection devices within the cooling zone.

The method as in any of the preceding clauses, wherein adjusting the position of the ejection devices further comprises: maintaining a constant radial gap between each ejection device of the plurality of ejection devices and an exterior surface of the mold shell while moving the mold shell axially from the heating zone to the cooling zone by adjusting the position of the plurality of ejection devices.

The method as in any of the preceding clauses, wherein the plurality of ejection devices comprises a plurality of nozzles extending radially towards the mold shell, and wherein adjusting the position of the ejection devices further comprises: radially moving at least one nozzle of the plurality of nozzles to modify a radial gap between an outlet of the at least one nozzle and an exterior surface of the mold shell.

The method as in any of the preceding clauses, wherein each ejection device of the plurality of ejection devices comprises a ring that surrounds the mold shell and defines a plurality of outlets, and wherein adjusting the position of the cooling system further comprises: axially moving the ring of at least one ejection device of the plurality of ejection devices within the cooling zone.

The method as in any of the preceding clauses, wherein the ring of a first ejection device of the plurality of ejection devices defines a first diameter, wherein the ring of a second ejection device of the plurality of ejection devices defines a second diameter, and wherein the first diameter and the second diameter are different.

The method as in any of the preceding clauses, wherein the mold shell defines a cooling circuit, and wherein the method further comprises: directing the coolant fluid through a passage defined in the cooling plate and a shaft attached to the cooling plate to the cooling circuit defined in the mold shell.

What is claimed is:

1. A casting system for forming a directionally-solidified casting component, the casting system defining an axial direction, a radial direction, and a circumferential direction, the casting system comprising:
    a chamber including a top and a bottom;
    a baffle plate disposed within the chamber between the top and the bottom, the chamber and the baffle plate collectively defining a heating zone and a cooling zone, the heating zone and the cooling zone separated by the baffle plate;
    a shaft, wherein the axial direction extends along the shaft from the cooling zone towards the heating zone;
    a cooling plate disposed on the shaft and movable between the heating zone and the cooling zone;
    a mold shell disposed on the cooling plate; and
    a cooling system for directing a coolant fluid towards the mold shell, wherein the cooling system comprises a plurality of ejection devices axially spaced apart from one another, the plurality of ejection devices comprising a first ejection device and a second ejection device, the first ejection device disposed axially closer to the baffle plate than the bottom, the second ejection device disposed axially closer to the bottom than the baffle plate.

2. The casting system as in claim 1, wherein each ejection device of the plurality of ejection devices comprises a plurality of nozzles extending towards the mold shell.

3. The casting system as in claim 2, wherein each nozzle of the plurality of nozzles is movable in the radial direction to adjust a radial gap between an outlet of the nozzle and an exterior surface of the mold shell.

4. The casting system as in claim 2, wherein each nozzle of the plurality of nozzles includes an actuator and a valve in operable communication with a controller.

5. The casting system as in claim 1, wherein each ejection device of the plurality of ejection devices comprises a ring that surrounds the mold shell and defines a plurality of outlets.

6. The casting system as in claim 5, wherein the ring of each ejection device is movable in the axial direction within the cooling zone.

7. The casting system as in claim 5, wherein the ring of a first ejection device of the plurality of ejection devices defines a first diameter, wherein the ring of a second ejection device of the plurality of ejection devices defines a second diameter, and wherein the first diameter and the second diameter are different.

8. The casting system as in claim 1, wherein the mold shell defines a cooling circuit, the cooling circuit in fluid communication with the cooling system.

9. The casting system as in claim 8, wherein the cooling system includes a passage defined in the shaft and the cooling plate, the passage being fluidly coupled to the cooling circuit of the mold shell.

10. The casting system as in claim 1, wherein the cooling system further comprises a coolant supply and a coolant fluid supply line.

11. A casting system for forming a directionally-solidified casting component, the casting system defining an axial direction, a radial direction, and a circumferential direction, the casting system comprising:
    a chamber;
    a baffle plate disposed within the chamber, the chamber and the baffle plate collectively defining a heating zone and a cooling zone, the heating zone and the cooling zone separated by the baffle plate;
    a shaft;
    a cooling plate disposed on the shaft and movable between the heating zone and the cooling zone;
    a mold shell disposed on the cooling plate; and
    a cooling system for directing a coolant fluid towards the mold shell, wherein the cooling system comprises a plurality of ejection devices axially spaced apart from one another, wherein each ejection device of the plurality of ejection devices comprises a ring that surrounds the mold shell and defines a plurality of outlets, and wherein the ring of a first ejection device of the plurality of ejection devices defines a first diameter, wherein the ring of a second ejection device of the plurality of ejection devices defines a second diameter, and wherein the first diameter and the second diameter are different.

12. A casting system for forming a directionally-solidified casting component, the casting system defining an axial direction, a radial direction, and a circumferential direction, the casting system comprising:
    a chamber;
    a baffle plate disposed within the chamber, the chamber and the baffle plate collectively defining a heating zone and a cooling zone, the heating zone and the cooling zone separated by the baffle plate;
    a shaft;
    a cooling plate disposed on the shaft and movable between the heating zone and the cooling zone;
    a mold shell disposed on the cooling plate, wherein the mold shell defines a cooling circuit; and
    a cooling system for directing a coolant fluid towards the mold shell, wherein the cooling circuit is in fluid communication with the cooling system, and wherein the cooling system includes a passage defined in the shaft and the cooling plate, the passage being fluidly coupled to the cooling circuit of the mold shell.

* * * * *